United States Patent [19]
Stein

[11] 4,140,572
[45] Feb. 20, 1979

[54] PROCESS FOR SELECTIVE ETCHING OF POLYMERIC MATERIALS EMBODYING SILICONES THEREIN

[75] Inventor: Leonard Stein, Dewitt, N.Y.

[73] Assignee: General Electric Company, Schenectady, N.Y.

[21] Appl. No.: 720,584

[22] Filed: Sep. 7, 1976

[51] Int. Cl.² .............. H01L 21/94; H01L 23/30
[52] U.S. Cl. ................................ 156/653; 134/28; 134/34; 156/656; 156/657; 156/661; 156/662; 156/664; 156/668; 156/904; 252/79.3; 427/336; 427/404; 427/407 R
[58] Field of Search ............ 156/3, 11, 13, 17, 18, 156/644, 656, 657, 659, 662, 664, 668, DIG. 904, 661, 652, 653; 260/33.4 P, 78 TF, 47 R, 96.5 E; 357/54, 72; 29/588; 134/3, 2, 40, 34, 28; 96/87 R; 252/79.3; 428/458, 447; 427/336, 404, 407

[56] References Cited

U.S. PATENT DOCUMENTS

| | | | |
|---|---|---|---|
| 3,024,138 | 3/1962 | Schlott | 134/34 |
| 3,416,962 | 12/1968 | Storek et al. | 134/2 |
| 3,615,913 | 10/1971 | Shaw | 29/588 |
| 3,640,778 | 2/1972 | Winfree et al. | 428/447 |
| 3,657,029 | 4/1972 | Fuller | 156/11 |
| 3,770,560 | 11/1973 | Elder et al. | 428/458 |
| 3,817,844 | 6/1974 | Kendall | 252/79.3 |
| 3,871,929 | 3/1975 | Schevey et al. | 134/3 |
| 3,890,177 | 6/1975 | Pfnahl et al. | 156/656 |
| 3,926,911 | 12/1975 | Greber et al. | 260/78 TF |
| 3,962,004 | 6/1976 | Sonneborn | 156/11 |
| 3,978,578 | 9/1976 | Murphy | 29/588 |

*Primary Examiner*—Jerome W. Massie
*Attorney, Agent, or Firm*—Donald M. Winegar; Joseph T. Cohen; Charles T. Watts

[57] ABSTRACT

Titanium is employed as a masking material for the selective etching of a coating material of a polyimide-silicone copolymer disposed on selective surface areas of electronic devices.

23 Claims, 7 Drawing Figures

PROCESS FOR SELECTIVE ETCHING OF POLYMERIC MATERIALS EMBODYING SILICONES THEREIN

BACKGROUND OF THE INVENTION

1. Field of the Invention

This invention relates to the selective chemical etching of polyimide-silicone copolymers for patterning thereof.

2. Description of the Prior Art

In the copending patent application of Abe Berger entitled "Polyimide-Silicone Copolymers For Coating Semiconductor Junctions", U.S. Ser. No. 652,092 the method of making the material and its application to selective surfaces areas of electronic devices is taught. After the copolymer material is applied to surface areas it becomes necessary on occasion to open windows in the coating and/or to remove material from selective areas. It is desirable that the removal of the unwanted portions of the copolymer material be done as quickly and as easily as possible to facilitate semiconductor device processing. It is also most desirable to maintain the registry and dimensions of the pattern.

An object of this invention is to provide a new and improved method to pattern a layer of a cured polyimide-silicone copolymer material.

Another object of this invention is to provide a new and improved method for selective chemical etching of a layer of a cured polyimide-silicone copolymer material which embodies titanium metal as a masking material.

A further object of this invention is to provide a new and improved method for selective chemical etching of a layer of a cured polyimide-silicone copolymer material which opens windows in the layer, the edges of which are substantially free of undercutting.

Other objects of this invention will, in part, be obvious and will in part, appear hereinafter.

BRIEF SUMMARY OF THE INVENTION

In accordance with the teachings of this invention there is provided a new and improved method for patterning a layer of cured silicone-polyimide copolymer material disposed on the surface of the body. Preferably, it is a method employed when the material is disposed on the surface of a body of semiconductor material. The layer is from 1 to 10 microns in thickness. A layer of titanium metal, preferably, of the order of 1000Å, is disposed on the copolymer material layer. A layer of positive photoresist material is disposed on the titanium metal material which is to act as a mask.

The layer of photoresist material is processed to form one or more windows therein. Selected surface areas of the layer of titanium metal are exposed in the windows. The exposed titanium metal is etched in fluoboric acid at room temperature for sufficient time to open windows in the titanium layer. The windows are aligned with those in the photoresist layer thereby enabling selected surface areas of the copolymer material to be exposed in the windows. The layer of photoresist is then stripped with acetone.

The copolymer material is etched in a phenol bearing solution such, for example, as A-20 Stripping Solution sold by the B & A Division of Allied Chemical. Chemical etching is performed until windows are opened in the layer to expose surface areas of the body thereat.

The processed body is plunged into an agitated acetone bath, rinsed in isoproponol and spin dried.

DESCRIPTION OF THE INVENTION

Figure 1:
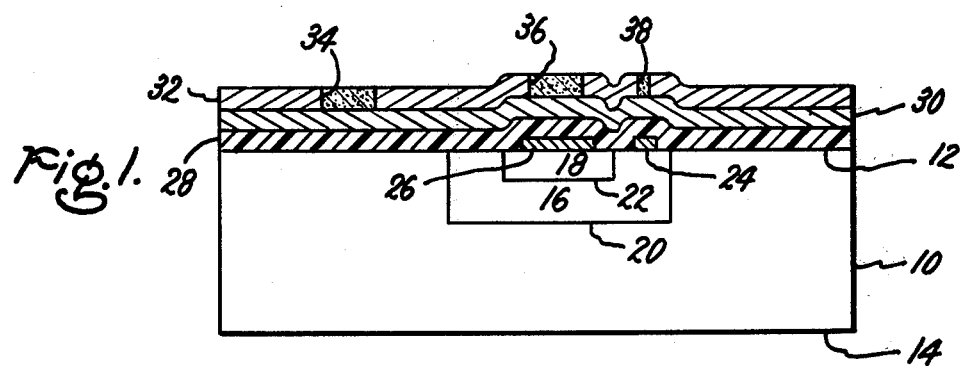
FIGS. 1 through 7 are side elevation views, partly in cross-section of a body of semiconductor material processed in accordance with the teachings of this invention.

The cured polyimide-silicone copolymer material which is to be patterned by selective etching is described in a copending patent application of Abe Berger having the same title "Polyimide-Silicone Copolymers For Coating Semiconductor Junctions" and assigned U.S. Ser. No. 652,092. The method of making the material and the application of the same to selective surface areas of electrical and electronic components is incorporated herein by reference.

Briefly, the polyimide-silicone co-polymer is the reaction product of a silicon-free organic diamine, an organic tetracarboxylic dianhydride and a polysiloxane diamine which is a polymer precursor soluble in a suitable organic solvent. On curing, it yields a copolymer having recurring structural units of the formula:

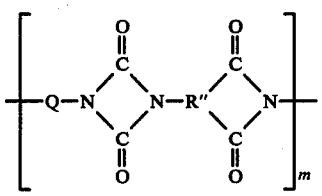

with from 15 to 40 mol percent and preferably 25 to 35 mol percent intercondensed structural units of the formula:

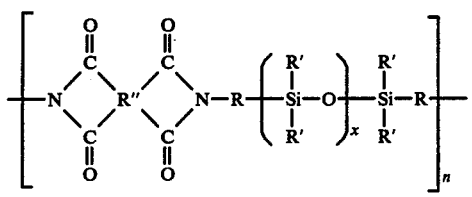

wherein R is a divalent hydrocarbon radical, R' is a monovalent hydrocarbon radical, R" is a tetravalent organic radical, Q is a divalent silicon-free organic radical which is the residue of an organic diamine, x is an integer having a value of 1–4 and m and n are different integers greater than 1, from 10 to 10,000 or more.

The above-mentioned block copolymers can be prepared by effecting reaction, in the proper molar proportions, of a mixture of ingredients comprising a diaminosiloxane of the general formula:

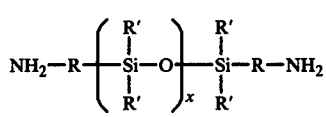

a silicon-free diamino compound of the formula:

$$NH_2 - Q - NH_2 \qquad (IV)$$

and a tetracarboxylic acid dianhydride having the formula:

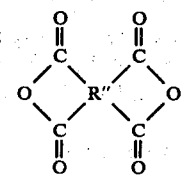   V.

wherein R, R', R", Q and x have the meanings given above.

Alternatively, a polysiloxane-imide composition may be used with comparable effectiveness by blending together a polyimide composed solely of recurring structural units of Formula I with a polyimide composed solely of recurring structural units of Formula II employing the polyimide of Formula II in such a molar proportion that the structural units of the latter are within the range of from 5 to 50 mol percent of said units based on the total molar concentration of the units of Formula II and the units of Formula I.

It will be recognized that the ultimate polyimide siloxane composition used in the practice of this invention will consist essentially of the imido structures found in Formulas I and II. However, the actual precursor materials resulting from the reaction of the diaminosiloxane, the silicon-free organic diamine and the tetracarboxylic acid dianhydride will initially be in the form of a polyamic acid structure composed of structural units of the formulas:

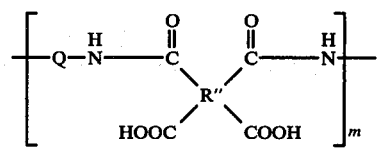   VI.

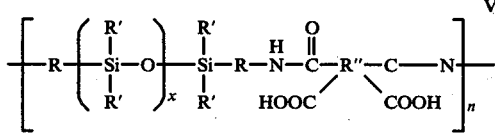   VII.

where R, R', R", Q, x, m and n have the meanings given above.

The diamino siloxanes of Formula III which may be used in the practice of the present invention include compounds having the following formulas:

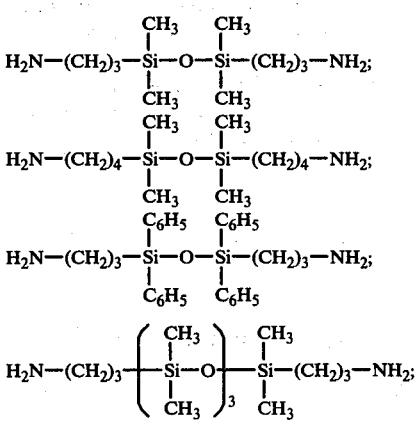

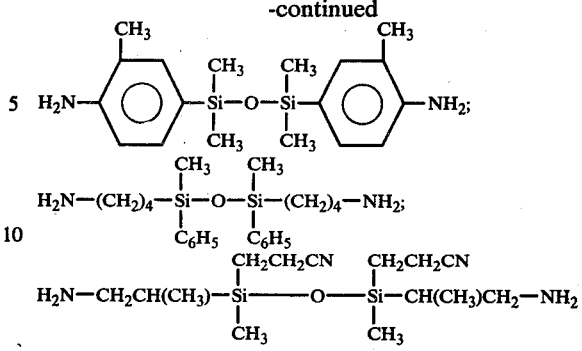

and the like.

The diamines of Formula IV above are described in the prior art and are to a large extent commercially available materials. Typical of such diamines from which the prepolymer may be prepared are the following:

m-phenylenediamine;
p-phenylenediamine;
4,4'-diaminodiphenylpropane;
4,4'-diaminodiphenylmethane;
4,4'-methylenedianiline;
benzidine;
4,4'-diaminodiphenyl sulfide;
4,4'-diaminodiphenyl sulfone;
4,4'-diaminodiphenyl ether;
1,5-diaminophthalene;
3,3'-dimethylbenzidine;
3,3'-dimethoxybenzidine;
2,4-bis($\beta$-amino-t-butyl)toluene;
bis(p-$\beta$-amino-t-butylphenyl)ether;
bis(p-$\beta$-methyl-o-aminopentyl)benzene;
1,3-diamino-4-isopropylbenzene;
1,2-bis(3-aminopropoxy)ethane;
m-xylylenediamine;
p-xylylenediamine;
bis(4-aminocyclohexyl)methane;
decamethylenediamine;
3-methylheptamethylenediamine;
4,4-dimethylheptamethylenediamine;
2,11-dodecanediamine;
2,2-dimethylpropylenediamine;
actamethylenediamine;
3-methoxyhexamethylenediamine;
2,5-dimethylhexamethylenediamine;
2,5-dimethylheptamethylenediamine;
3-methylheptamethylenediamine;
5-methylnonamethylenediamine;
1,4-cyclohexanediamine;
1,12-octadecanediamine;
bis(3-aminopropyl)sulfide;
N-methyl-bis(3-aminopropyl)amine;
hexamethylenediamine;
heptamethylenediamine;
nonamethylenediamine;

and mixtures thereof. It should be noted that these diamines are given merely for the purpose of illustration and are not considered to be all inclusive. Other diamines not mentioned will readily be apparent to those skilled in the art.

The tetracarboxylic acid dianhydrides of Formula V may further be defined in that the R" is a tetravalent radical, e.g. a radical derived from or containing an aromatic group containing at least 6 carbon atoms characterized by benzenoid unsaturation, wherein each of the 4 carbonyl groups of the dianhydride are attached to a separate carbon atom in the tetravalent radical, the carbonyl groups being in pairs in which the groups in each pair are attached to adjacent carbon atoms of the R" radical or to carbon atoms in the R" radical at most one carbon atom removed, to provide a 5-membered or 6-membered ring as follows:

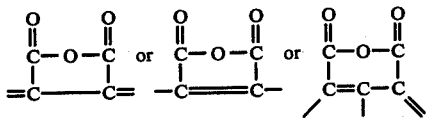

Illustrations of dianhydrides suitable for use in the present invention (with their reference acronym designated in parenthesis) include:
pyromellitic dianhydride (PMDA);
2,3,6,7-napthalene tetracarboxylic dianhydride;
3,3',4,4'-diphenyl tetracarboxylic dianhydride;
1,2,5,6-napthalene tetracarboxylic dianhydride;
2,2',3,3'-diphenyl tetracarboxylic dianhydride;
2,2-bis(3,4-dicarboxyphenyl)propane dianhydride;
bis(3,4-dicarboxyphenyl)sulfone dianhydride;
2,2-bis[4-(3,4-dicarboxyphenoxy)phenyl]propane dianhydride (BPA dianhydride);
2,2-bis[4-*2,3-dicarboxyphenoxy)phenyl]propane dianhydride;
benzophenone tetracarboxylic acid dianhydride (BPDA);
perylene-1,2,7,8-tetracarboxylic acid dianhydride;
bis(3,4-dicarboxyphenyl)ether dianhydride, and
bis(3,4-dicarboxyphenyl)methane dianhydride;
and aliphatic anhydrides such as cyclopentane tetracarboxylic dianhydride, cyclohexane tetracarboxylic dianhydride, butane tetracarboxylic dianhydride, etc. The incorporation of other anhydrides, such as trimellitic anhydride, to make amide-imide-siloxane polymers is not precluded.

Application of the block copolymers or blends of polymers in a suitable solvent (including, for example, N-methylpyrrolidone, N,N-dimethylacetamide, N,N-dimethylformamide, etc.) alone or combined with non-solvents, to the substrate material may be by conventional means such as dipping, spraying, painting, spinning, etc. The block copolymers or blends of polymers may be dried in an initial heating step at temperatures of about 75° to 125° C. for a sufficient time frequently under vacuum to remove the solvent. The polyamic acid is then converted to the corresponding polyimide-siloxane by heating at temperatures of about 150° C.–300° C. for a sufficient time to effect the desired conversion to the polyimide structure and final cure.

A preferred curing cycle for materials of the above general formula is as follows:
 (a) from 15 to 30 minutes of from 135° C. to 150° C. in dry $N_2$.
 (b) from 15 to 60 minutes at about 185° C. ± 10° C. in dry $N_2$.
 (c) from 1 to 3 hours at about 225° C. in vacuum.
Alternately, it has been found that one may be able to cure the coating material in other atmospheres such, for example, as air for ease of commercial application of this invention.

In order to describe the invention more distinctly, I will describe the novel method of patterning the cured copolymer material on the surface of a semiconductor device. In particular, with reference to FIGS. 1 through 6, a body 10 of semiconductor material of N-type conductivity having opposed major surfaces 12 and 14 is processed to form regions 16 and 18 of P and N type conductivity respectively therein. P-N junctions 20 and 22 are formed at the abutting, contiguous surfaces of the regions 16 and the body 10 and regions 16 and 18, respectively. End portions of the P-N junctions 16 and 18 are exposed at the surface 12.

The material of the body 10 may be silicon, silicon carbide, germanium, gallium arsenide, a compound of a Group III element and a Group V element and a compound of a Group II element and a Group VI element. In order to illustrate the novel process of this invention the material of the body is said to be of silicon.

An electrical contact 24 is affixed to the region 16 and is in ohmic electrical contact therewith. An ohmic electrical contact 26 is affixed to the region 18. A layer 28 of the cured silicone-polyimide copolymer material is disposed on the surface 12 and the contacts 24 and 26. Although the thickness of the layer 28 may be of the order of 10 microns or more, a thickness of from 1 to 5 microns is preferred.

A layer 30 of titanium is vapor deposited upon the layer 28 of cured silicone-polyimide copolymer material from a source of metallic titanium. A thickness of from 500Å to 3000Å of the layer 30 has been found to be satisfactory as a suitable mask for selective chemical etching of the material of the layer 28. Preferably, the layer 30 is of the order of 1000Å in thickness.

Employing photolithographical techniques, a layer 32 of a photoresist material is disposed on the layer 30 of the titanium. Preferably, the photoresist material is a positive material such, for example, as OFPR-2 from Tokyo Ohka America, Inc. The photoresist is pre-cured by 15 minutes of air drying at room temperature followed by baking at 90° C., approximately for a period of about 30 minutes in nitrogen. A suitable mask, not shown, is disposed on the photoresist layer 32, properly aligned in order that the windows to be opened in the silicone-polyimide material layer 28 are oriented properly with respect to contacts 24 and 26 and a selected surface area of the surface 12. The masked layer 32 of photoresist is exposed to ultraviolet radiation for the proper length of time. The exposed layer 32 is then developed. If desired, the developed exposed layer 32 may be post cured by 140° C. bake for 30 min. in order to enhance its adhesion to the titanium layer. In either case, developing of the exposed layer 32 removes unfixed photoresist material from the window areas 34, 36 and 38 of the layer 32. The remainder of the material of the layer 32 is "fixed".

Figure 2:
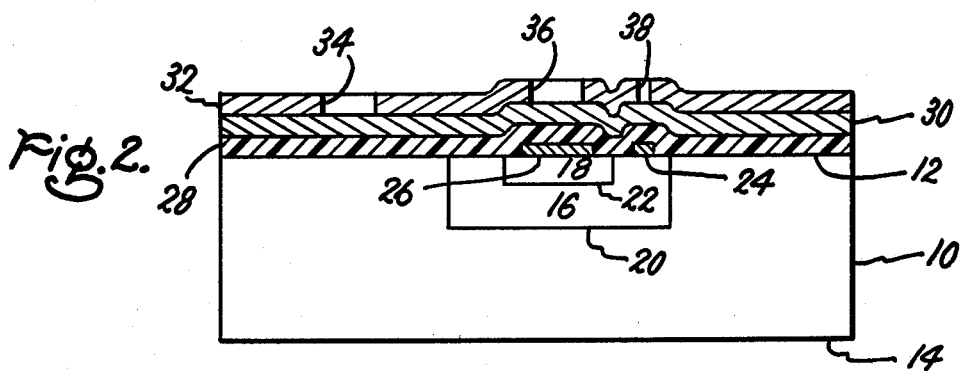

Windows 34, 36 and 38 now expose selective surface areas of the layer 30 of titanium therein. The structure is as shown in FIG. 2.

The exposed selective surface areas of the layer 30 of titanium is selectively etched by a fluoboric acid solution at room temperature. Etching the titanium metal exposed in the windows 34, 36 and 38 with fluoboric acid is continued until windows 40, 42 and 44 are formed in the layer 30 to expose selective surface areas of the silicone-polyimide copolymer material therein. It has been determined that for a thickness of the layer 30 of titanium of the order of 1000Å, an etching time of from about 30 to approximately 60 seconds is desirable. The processed body is rinsed in water and dried by spinning.

Figure 3:
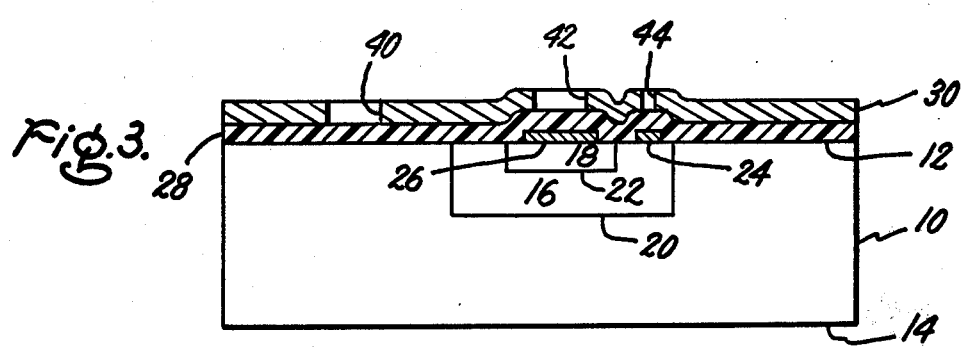

The "fixed" photoresist of the layer 32 is removed by placing the processed body in an acetone bath for a sufficient time to completely dissolve the "fixed" photoresist material. It is then rinsed in isopropanol and dried by spinning. The resulting structure is as shown in FIG. 3.

The exposed surface areas of the layer 28 is then selectively etched in a solution containing phenol. A solution which is available commercially is known as "A-20 Stripping Solution". It is manufactured by B & A Division of Allied Chemical and is normally employed for stripping negative photoresist materials. Etching is preferred at a temperature of from 50° C. to 80° C. for a sufficient period of time to open windows 46, 48 and 50 in the layer 28. For a thickness of the layer 28 of about 1.5 to 2 microns, an etching time of 2 minutes at 60° C. has been sufficient to open the windows 46, 48 and 50 to expose selective surface areas of the surface 12 and the contacts 26 and 24, respectively, therein.

Figure 4:
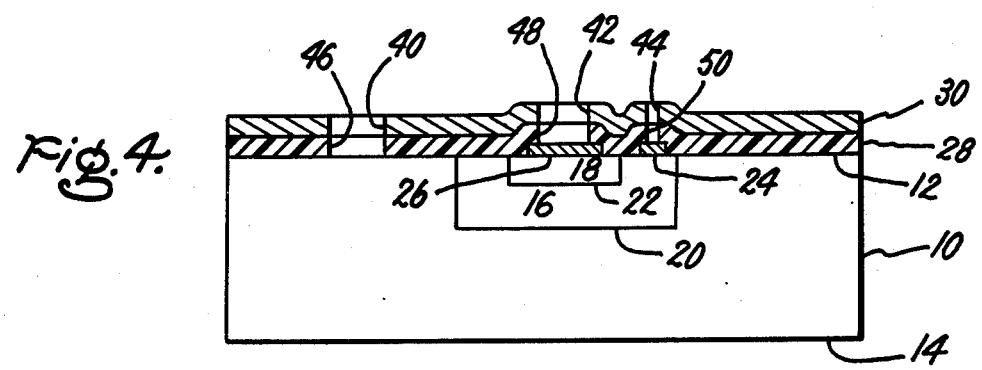

Upon completion of the etching of the layer 28, the processed body 10 is plunged into an agitated bath of acetone for a sufficient time to remove all traces of the etching solution. Preferably, ultrasonic means is employed to achieve best results. Ultrasonic agitation for a period of about 15 seconds is sufficient to stop the etching action and cleanse the surfaces. The processed body is rinsed in isopropanol for a period of about 1 minute and dried, preferably by spinning. The completed structure is as shown in FIG. 4.

Care is exercised to prevent taking the processed body from the etching solution and putting it directly into a water rinse and then drying the revised body. Should this occur, a filmy, cloudy residue is formed on the exposed surfaces of the layer 28 and the walls of the windows 46, 48 and 50. Ultrasonic agitation in water or acetone does not remove the film.

The acetone rinse immediately after etching does not preclude the possibility of the forming of the cloudy film. However, complete removal of the film is achievable by ultrasonic agitation in acetone.

The cloudy film is believed to be an organic reaction product. The presence of the cloudy film is detrimental since it may interfere with the making of ohmic contacts in the exposed contact areas.

A step-saving option may be exercised by not separately removing the fixed photoresist of the layer 32 with acetone. If this step is omitted, the photoresist will be removed simultaneously with the selective chemical etching of the silicone-polyimide copolymer layer 28 with the "A-20 Stripping Solution".

Figure 5:
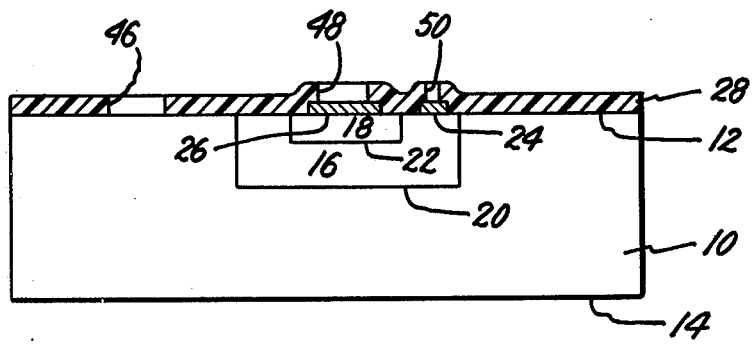

The titanium mask, or layer 30 of titanium, is stripped in fluoboric acid at room temperature. A period of from 30 to 60 seconds is required to strip a layer 30 of 1000Å in thickness. The processed body is rinsed in water and dried, preferably by spinning. The final structure is as shown in FIG. 5.

Figure 6:
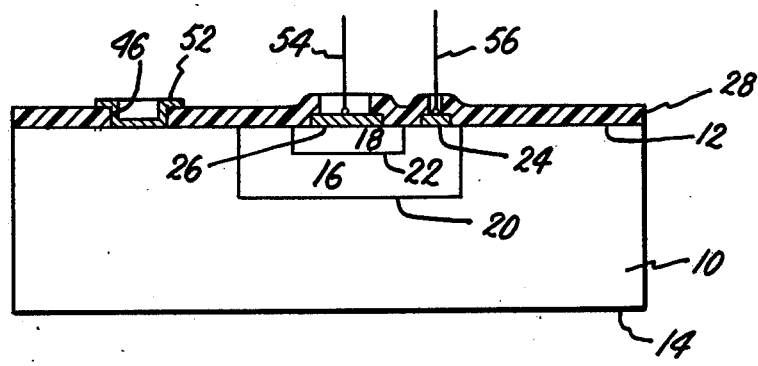

The body 10 may now be processed further as required. For example, as shown in FIG. 6, a layer 52 of electrical contact metal, such for example, as aluminum may be deposited in the window 46 to contact the surface region of the body 10 exposed therein. Standard photolithographical techniques followed by selective etching is practiced to achieve the result illustrated. Additionally, electrical leads 54 and 56 may be affixed to the respective contacts 26 and 24 to provide an electrical connection thereto.

The process as described does not attack the exposed surface area of aluminum contacts 24 and 26 at any time.

Preferably, when a layer of aluminum is to be deposited on the surface of the layer 28 of silicone-polyimide copolymer material and in any of the windows 46, 48 and 50 therein, the walls of the windows 46, 48 and 50 should be tapered.

Tapering of the walls 46, 48 and 50 is accomplished by heating the structure shown in FIG. 5 above the glass transition temperature of the silicone-polyimide copolymer material. In the temperature range of 400° C. to 450° C., a 5 to 15 minute bake in nitrogen will taper an edge from an initial 70° to 80° slope to a slope of from 50° to 60°. This baking prior to aluminum deposition has the further advantage of completing all significant densification and plastic flow of layer 2B before the metal is applied. Consequently, subsequent heating of the structure of FIG. 6, for the purpose of enhancing contact ohmicity will not lead to metallization failures due to motion of the underlying material.

Figure 7:
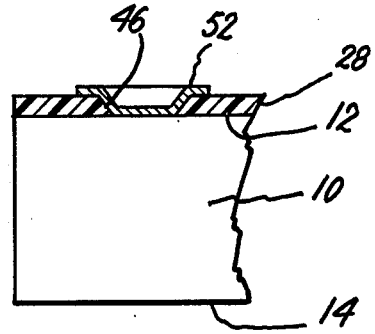

The processed body 10 of FIG. 6 is shown in FIG. 7 with the electrical contact 52 of aluminum metal affixed to the exposed portion of the surface 12.

To illustrate the teachings of this invention several wafers of silicon semiconductor material, each about 2 inches in diameter, were processed to form a plurality of devices in each wafer. Aluminum metal was deposited on predetermined surface areas of the devices.

A polymer precursor solution was formed by reacting benzophenone tetracarboxylic acid dianhydride with methylene dianiline and bis(-γ-aminopropyl)tetramethyldisiloxane, the latter two diamine materials being present in the molar ratio of 70:30. The reaction was carried out at a temperature of less than 50° C. and using suitably purified and dried materials to favor a large molecular weight polymer. A solution of the polymer precursor in the form of the polyamic acid form dissolved in N-methyl-2-pyrrolidone containing 25% solids by weight was disposed on the surface of the devices. About 7 to 10 drops of the precursor solution was disposed on the surface of the wafers, and therefore the devices. The wafers was then spun at from about 2000RPM to about 3000RPM for 20 seconds. The coated wafers were cured at 135° C. ± 5° C. for about 30 minutes in Nitrogen, 185° C. ± 5° C. in Nitrogen for about 30 minutes and at 225° C. in a vacuum of 29" Hg for about 2 hours. The layer of copolymer material was from 1.5 to 2.0 microns in thickness when cured.

A layer of titanium metal, about 1000Å in thickness, was vapor deposited from a metallic source in an electron beam evaporator. A layer of positive photoresist material was disposed on the titanium layer and processed to open windows therein.

The exposed portions of the titanium layer in the windows of the photoresist material was etched in fluoboric acid for about 30 to about 60 seconds at room temperature. The processed wafers were washed in deionized water and dried by spinning. The photoresist material was stripped in acetone, the wafers were then rinsed in isopropanol and spin dried.

Using proprietary "A-20 Stripping Solution" containing phenol, described previously in this specification, the copolymer material exposed in the windows of the titanium mask was etched. Etching continued for about 2 minutes in the solution maintained at 60° C. ± 1° C. The processed wafers were plunged into an acetone bath agitated by ultrasonic means for about 15 seconds. The wafers were rinsed in isopropanol and spin dried. The titanium mask was stripped in fluoboric acid at room temperature in from 30 to 60 seconds. The wafers were rinsed in deionized water and spin dried.

The wafers were then examined. The exposed aluminum contact surfaces had not been attacked by the etchant materials of the process. The windows were well defined and had dimensional stability. The edges of the copolymer material were not visibly undercut.

I claim as my invention:

1. A method for the selective chemical etching of a cured layer of a silicone-polyimide copolymer material disposed on a surface of a body to open windows therein to expose selected surface portions of the surface thereat including the process steps of:

(a) forming a layer of a cured silicone-polyimide copolymer material on a processed body of semiconductor material, the copolymer material consisting of a reaction product of a silicon-free organic diamine, an organic tetracarboxylic dianhydride and a polysiloxane which when cured has the recurring structural units of the formula:

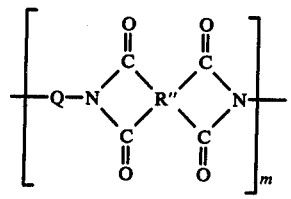
I.

with from 5 to 40 mol percent intercondensed structural units of the formula:

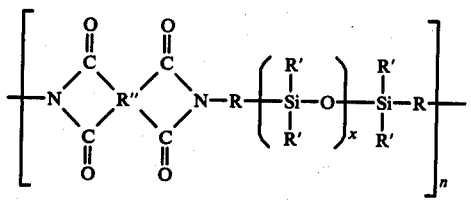
II.

wherein:
R is a divalent hydrocarbon radical;
R' is a monovalent hydrocarbon radical;
R'' is a tetravalent organic radical;
Q is a divalent silicon-free organic radical which is the residue of an organic diamine;
x is an integer having a value of 1–4, and
m and n are integers greater than 1;

(b) depositing a layer of titanium metal of a predetermined thickness on the layer of silicone-polyimide copolymer material;

(c) depositing a positive photoresist material on the layer of titanium;

(d) processing the layer of photoresist material to open one or more windows therein to expose a selected surface area of the layer of titanium metal thereat;

(e) chemically etching the exposed titanium metal selectively in fluoboric acid to open one or more windows therein, aligned with the respective windows in the layer of photoresist, to expose selected surface areas of the layer of silicone-polyimide copolymer material thereat, and (f) chemically etching the layer of silicone-polyimide copolymer material selectively in a phenol bearing solution to open one or more windows in the copolymer layer, aligned with the respective windows of the layer of titanium, to expose the selected surface areas of the surface thereat.

2. The method of claim 1 including the additional process steps after (f) of:

(g) disposing the processed body in an acetone bath.

3. The method of claim 1 including the further process step after selectively chemically etching the layer of titanium of
stripping the layer of photoresist material from the layer of titanium.

4. The method of claim 2 wherein
the etching of the layer of titanium is practiced at room temperature.

5. The method of claim 2 wherein
the acetone bath is agitated by ultrasonic means.

6. The method of claim 2 including the further process step of
stripping the layer of titanium from the copolymer material layer in fluoroboric acid.

7. The method of claim 1 wherein
the layer of titanium is of the order of 1000Å in thickness.

8. The method of claim 7 wherein
the layer of silicone-polyimide copolymer material is from 1 to 10 microns in thickness.

9. The method of claim 1 wherein
etching of the copolymer material is in the solution maintained at about 60° C.

10. The method of claim 3 wherein
the acetone bath is agitated by ultrasonic means.

11. The method of claim 1 wherein
a stripping of the layer of photoresist material from the titanium is practiced simultaneously with selective chemical etching of the copolymer material.

12. The method of claim 5 wherein
the thickness of the copolymer layer is from 1 micron to 10 microns.

13. The method of claim 1 wherein
the polymeric material is the reaction product of benzophenone tetracarboxylic acid dianhydride with methylene dianiline and bis(-γ-aminopropyl)-tetramethyl-disiloxane.

14. The method of claim 13 wherein
the mol percent of intercondensed structural units is from 25 to 35.

15. The method of claim 14 wherein
the mol percent of intercondensed structural units is about 30.

16. The method of claim 13 including the additional process step after (f) of:

(g) disposing the processed body in an acetone bath.

17. The method of claim 16 wherein
the etching of the layer of titanium is practiced at room temperature.

18. The method of claim 17 wherein
the acetone bath is agitated by ultrasonic means to stop the etching action of the etchant, to remove traces of the etchant solution, and to cleanse the exposed surfaces of the element and the copolymer material.

19. The method of claim 16 including the further process step of
stripping the layer of titanium from the copolymer material layer in fluoboric acid.

20. The method of claim 13 wherein
the layer of titanium is of the order of 1000Å in thickness.

21. The method of claim 20 wherein the layer of silicone-polyimide copolymer material is from 1 to 10 microns in thickness.

22. The method of claim 13 wherein etching of the copolymer material is in the solution maintained at about 60° C.

23. The method of claim 14 wherein the layer of silicone-polyimide copolymer material is from 1 to 10 microns in thickness.

* * * * *